United States Patent
Fujimoto et al.

(10) Patent No.: US 9,776,854 B2
(45) Date of Patent: Oct. 3, 2017

(54) DEVICE AND METHOD OF MANUFACTURING THE SAME

(71) Applicant: KABUSHIKI KAISHA TOSHIBA, Minato-ku, Tokyo (JP)

(72) Inventors: Akira Fujimoto, Kawasaki Kanagawa (JP); Naofumi Nakamura, Tokyo (JP); Tamio Ikehashi, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 15/068,511

(22) Filed: Mar. 11, 2016

(65) Prior Publication Data

US 2016/0289060 A1    Oct. 6, 2016

(30) Foreign Application Priority Data

Apr. 3, 2015    (JP) .................................. 2015-077048

(51) Int. Cl.
  *H01L 29/786* (2006.01)
  *B81B 3/00* (2006.01)
  *B81C 1/00* (2006.01)

(52) U.S. Cl.
  CPC ........ *B81B 3/0072* (2013.01); *B81C 1/00365* (2013.01); *B81C 2201/0167* (2013.01); *B81C 2201/0169* (2013.01)

(58) Field of Classification Search
  CPC ............ H01G 5/16; H01G 5/18; H01G 5/011; H01H 59/0009; H01H 2057/006; H01L 21/02532
  USPC .. 257/E21.094, E21.104, E21.121, E21.372, 257/E21.411–E21.416, E21.613, 223, 257/227, 291, 292, 439, 443, 655, E27.1, 257/E27.125, E27.112, E29.117, E29.145, 257/E29.147, E29.151, E29.182, E29.202, 257/E29.273–E29.299, E29.314, E29.32, 257/E23.016; 438/149, 50, 52
  See application file for complete search history.

(56) References Cited

U.S. PATENT DOCUMENTS 7,176,111 B2    2/2007 Baert et al.
7,557,027 B2    7/2009 Witvrouw et al.
(Continued)

OTHER PUBLICATIONS

Jong-Hyeok Park, et al., "Nucleation-controlled gold-induced-crystallization for selective formation of Ge(100) and (111) on insulator at low-temperature (~250oC)", Applied Physics Letters 103, 2013, pp. 082102-1 to 082102-4.

*Primary Examiner* — Jonathan Han
(74) *Attorney, Agent, or Firm* — Holtz, Holtz & Volek PC (57) ABSTRACT

According to one embodiment, a method of manufacturing a device is provided. A amorphous metal layer is formed. A metal layer containing metal and having a crystal plane oriented to a predetermined plane is formed on the amorphous metal layer. A first layer containing semiconductor including silicon, and metal identical to the metal contained in the metal layer is formed on the metal layer. The first layer is changed to a second layer containing a compound of the semiconductor and the metal, the compound having a crystal plane oriented to the predetermined plane. A third layer containing polycrystalline silicon-germanium and having a crystal plane oriented to the predetermined plane is formed on the second layer.

19 Claims, 10 Drawing Sheets

(56) References Cited

U.S. PATENT DOCUMENTS

| | | | |
|---|---|---|---|
| 2007/0246764 A1* | 10/2007 | Herner | C30B 1/00 257/309 |
| 2008/0237599 A1* | 10/2008 | Herner | B82Y 10/00 257/66 |
| 2010/0133573 A1* | 6/2010 | Nowatari | H01L 51/5016 257/98 |
| 2010/0255662 A1 | 10/2010 | Witvrouw | |

* cited by examiner

_(12) United States Patent — US 9,776,854 B2_

DEVICE AND METHOD OF MANUFACTURING THE SAME

CROSS-REFERENCE TO RELATED APPLICATIONS

This application is based upon and claims the benefit of priority from Japanese Patent Application No. 2015-077048, filed Apr. 3, 2015, the entire contents of which are incorporated herein by reference.

FIELD

Embodiments described herein relate generally to a device including silicon-germanium and a method of manufacturing the same.

BACKGROUND

As one of semiconductor materials other than silicon, silicon-germanium is known. Also, as a device including a layer containing silicon-germanium, for example, a microelectro-mechanical systems (MEMS) device or a thin film transistor (TFT) is known.

DETAILED DESCRIPTION

In general, according to one embodiment, a method of manufacturing a device is provided. The method includes forming an amorphous metal layer; forming a metal layer containing metal and having a crystal plane oriented to a predetermined plane, on the amorphous metal layer; and forming a first layer containing semiconductor including silicon, and metal identical to the metal contained in the metal layer, on the metal layer. The method further includes changing the first layer to a second layer containing a compound of the semiconductor and the metal, the compound having a crystal plane oriented to the predetermined plane; and forming a third layer containing polycrystalline silicon-germanium and having a crystal plane oriented to the predetermined plane, on the second layer.

In general, according to another embodiment, a method of manufacturing a device is provided. The method includes: forming a first insulating layer; forming a first layer on the first insulating layer, the first layer comprising first and second columnar members, and amorphous silicon-germanium or amorphous silicon filling a gap between the first and second columnar members; and forming a second insulating layer on the first layer. The method further includes changing the amorphous silicon-germanium or the amorphous silicon to a silicon-germanium or silicon having a crystal plane oriented to a predetermined plane by annealing the first layer; removing the second insulating layer; and forming a second layer on the first layer containing polycrystalline silicon-germanium having a crystal plane oriented to the predetermined plane.

Embodiments will be hereinafter described with reference to the accompanying drawings. The drawings are schematic and conceptual, and the ratios between the dimensions of elements shown the drawings, etc., are not necessarily equal to those between the actual dimensions of the elements, etc. Furthermore, in each of the drawings, elements identical to those in another one or others of the drawings will be denoted by the same reference numbers as in the other or others, and once an element is explained, its explanation will not be repeated, except when it needs to be repeated.

First Embodiment

First of all, it should be noted that silicon-germanium to be applied to a MEMS device or a TFT needs to be formed at a low temperature of, for example, 450° C. or less. This is because if silicon-germanium is formed at a high temperature, this influences an element or elements and a circuit or circuits which have already been formed.

As a method for forming silicon-germanium at a low temperature, chemical vapor deposition (CVD) is present. When employing a method in which a silicon-germanium layer is formed on an amorphous layer by CVD, the crystal orientation of the silicon-germanium layer is oriented randomly or preferentially oriented to a (110) plane.

In the MEMS device, a silicon-germanium layer is used as a movable part, and needs to have a thickness of 10 μm or more. Also, the silicon-germanium layer needs to have a low stress in terms of function and a high throughput in terms of cost.

In the case where silicon-germanium is formed to have a crystal plane randomly oriented by the above mentioned method, the formed silicon-germanium has a great stress, thus lowering its function. This is a problem. On the other hand, in the case were a silicon-germanium layer is formed to have a crystal plane preferentially oriented to a (110) plane by the above mentioned method, it is necessary to determine specific conditions for formation of the silicon-germanium layer. For example, in addition to silane and germane which are sources of silicon-germanium, it is necessary to supply hydrogen the amount of which is 10 times larger than the amount of the sources. As a result, the silicon-germanium layer is formed at a lower speed; i.e., the throughput is lowered. This is another problem.

Moreover, the above mentioned method does not guarantee that the entire of the silicon-germanium layer is oriented to the (110) plane. That is, the silicon-germanium layer includes a (111) plane and amorphous in addition to the (110) plane. As a result, the stress of the silicon-germanium, which is obtained by the above mentioned method and is oriented to the (110) plane, is not sufficiently reduced.

The first embodiment relates to a method for forming a silicon-germanium layer having a crystal plane oriented mainly to a (111) plane or (110) plane, in order that the silicon-germanium layer have a low stress and enable a high throughput to be achieved. In order that an orientation layer can be formed regardless of CVD process conditions, a layer having a lattice constant close to that of silicon-germanium, or a layer formed of silicon-germanium is prepared as an underlayer at the time of the CVD.

It should be noted that a silicon-germanium layer oriented to a (100) plane has a lower mechanical strength than the silicon-germanium layer oriented to the (111) plane or the (110) plane of the present embodiment. Therefore, the silicon-germanium layer oriented to the (100) plane is not used in the present embodiment.

FIGS. 1-5 are cross-sectional views for explaining a method for forming a layer containing silicon-germanium (which will be hereinafter referred to as a SiGe layer).

Figure 1:
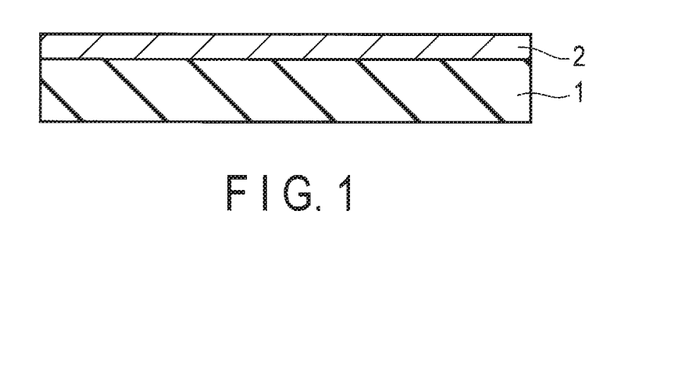
FIG. 1 is a cross-sectional view for explaining a process in a method for forming a silicon-germanium layer according to a first embodiment.

[FIG. 1]

An amorphous metal layer 2 is formed on an amorphous layer (underlayer) 1. The amorphous layer 1 is formed of, for example, silicon oxide; however, it may be formed of a semiconductor or metal. The amorphous metal layer 2 is formed of, for example, tantalum (Ta), tantalum nitride (TaN) or nickel tantalum (NiTa), which is material containing tantalum. The thickness of the amorphous metal layer 2 is not especially defined. However, it is sufficient that the amorphous metal layer 2 has a thickness of 2 nm, in order to form an orientation layer. Although the amorphous metal layer 2 may be made thicker, in terms of stress it is preferable not to do so. That is, it is appropriate that the thickness of the amorphous metal layer 2 is set to 50 nm or less. The amorphous metal layer 2 is formed by, for example, sputtering process. Under the amorphous layer 1, a further layer may be provided, which includes, for example, a CMOS circuit.

Figure 2:
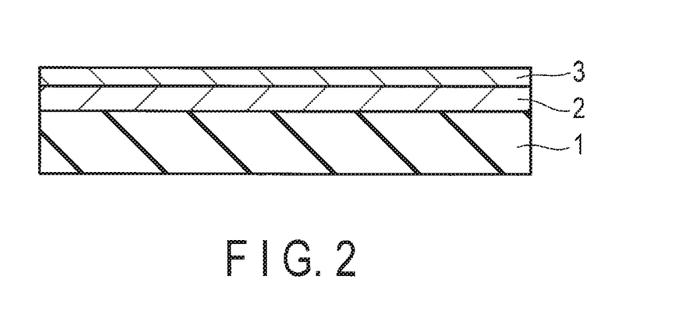
FIG. 2 is a cross-sectional view for explaining a process following the process of FIG. 1 in the method for forming the silicon-germanium layer according to the first embodiment.

[FIG. 2]

On the amorphous metal layer 2, a metal layer (hereinafter referred to as an orientation layer) 3 containing metal having a crystal plane oriented to a predetermined plane is formed. An upper surface of the orientation layer 3 is oriented to a (111) plane. The amorphous metal layer 2 functions as an auxiliary underlayer for causing the crystal plane of the orientation layer 3 to be oriented to a predetermined plane with a high accuracy. The above metal is a refractory metal such as nickel (Ni) or cobalt (Co). The orientation layer 3 has a thickness of, for example, several tens of nanometers. Also, the orientation layer 3 is formed by, for example, depositing the above metal on the amorphous metal layer 2 by sputtering process. The lattice constants of Ni and Co are greatly different from that of SiGe.

Figure 3:
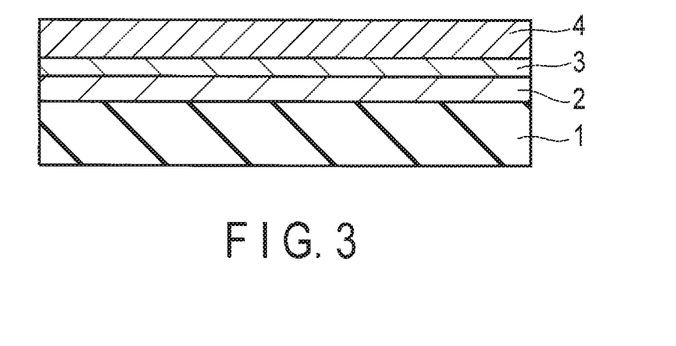
FIG. 3 is a cross-sectional view for explaining a process following the process of FIG. 2 in the method for forming the silicon-germanium layer according to the first embodiment.

[FIG. 3]

On the orientation layer 3, a layer (first layer) 4 containing silicon-germanium. (SiGe) and the above metal (refractory metal) is formed. The layer 4 will be hereinafter referred to as a precursor layer 4. This is because when heated in process to be carried out later, the layer 4 is changed to a layer (metallic silicide layer) containing an alloy of Si and the above metal.

The crystal plane of metal contained in the orientation layer 3 is oriented to a (111) plane or (110) plane, whereas that of metal in the precursor layer 4 is not necessarily oriented to a (111) plane or (110) plane.

The precursor layer 4 includes a layer (single layer) in which for example, SiGe and the above metal are mixed together. Such a single layer is formed by sputtering process using a target containing, for example, SiGe and the above metal.

The precursor layer 4 may include a laminate of a layer containing SiGe and a layer containing the metal (for example, 5 nm thickness Ni). Such a laminate is formed by sputtering process using a plurality of targets including, for example, a target containing SiGe and a target containing the above metal.

The amounts of Si and the above metal in the precursor layer 4 are determined such that if the precursor layer 4 is heated, an alloy (for example, Ni (SiGe)$_2$ or Co (SiGe)$_2$) layer of Si and the above metal is formed.

Figure 4:
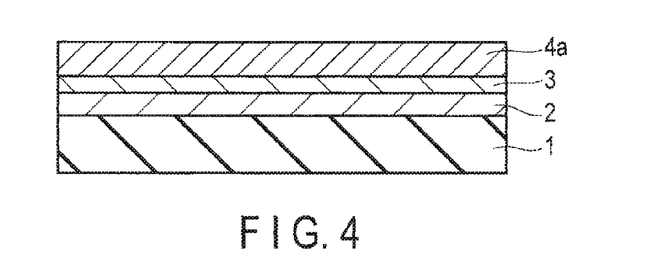
FIG. 4 is a cross-sectional view for explaining a process following the process of FIG. 3 in the method for forming the silicon-germanium layer according to the first embodiment.

[FIG. 4]

The precursor layer 4 is changed to an alloy layer (second layer) 4a by heating (annealing) the precursor layer 4 in an inactive gas atmosphere. The inactive gas atmosphere is an atmosphere containing, for example, nitrogen, argon, etc. The above annealing is carried out at, for example, 400° C. or more and 450° C. or less.

By the annealing, it is possible to obtain an alloy layer 4a (Ni (SiGe)$_2$ layer or a Co (SiGe)$_2$ layer), which has a crystal face oriented to a (111) plane or (110) plane, and has a lattice constant close to that of SiGe. The obtaining of the alloy layer 4a oriented to the (111) plane or (110) plane of is confirmed by θ/2θ measurement using XRD (X-ray diffraction) method. In addition, a X-ray rocking curve half-width of the alloy layer 4a is about 6.7°, which is a good result. That is, it is confirmed that the alloy layer 4a is highly oriented to the (111) plane or (110) plane. When a conventional method is used, the half-width is about 15°.

With respect to the composition $Si_{1-x}Ge_x$ of SiGe in the Ni (SiGe)$_2$ layer or the Co (SiGe)$_2$ layer, the composition ratio x ranges between 0 and 1 (both included), and preferably greater than 0.3 and less than or equal to 1 in order to form the Ni (SiGe)$_2$ layer or the Co (SiGe)$_2$ layer at a low temperature. In the present embodiment, the precursor layer 4 includes germanium, so that the composition ratio x does not take 0 (x≠0).

The thickness of the Ni (SiGe)$_2$ layer or the Co (SiGe)$_2$ layer is not especially defined. However, it is sufficient that the Ni (SiGe)$_2$ layer or the Co (SiGe)$_2$ layer has a thickness of 2 nm, in order to grow a SiGe orientation layer. Although the Ni (SiGe)$_2$ layer or the Co (SiGe)$_2$ layer may be made to have a greater thickness, in terms of stress it is preferable not to do so. That is, it is appropriate that the thickness of the Ni (SiGe)$_2$ layer or the Co (SiGe)$_2$ layer is set to 50 nm or less, as well as the amorphous metal layer 2.

Furthermore, in terms of stress it is preferable that the total thickness of the amorphous layer 2 and the orientation layer 3 be smaller, and that the total thickness be 50 nm or less in order to prevent it from influencing a polycrystalline SiGe layer to be formed above the orientation layer 3.

Figure 5:
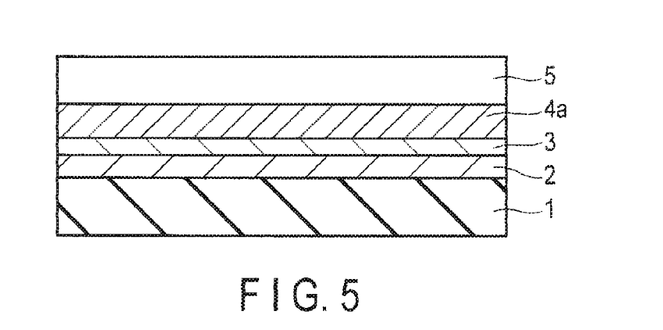
FIG. 5 is a cross-sectional view for explaining a process following the process of FIG. 4 in the method for forming the silicon-germanium layer according to the first embodiment.

[FIG. 5]

A polycrystalline $Si_{1-y}Ge_y$ layer (third layer) 5 having a crystal plane oriented to a (111) plane or (111) plane is formed on the alloy layer 4a having the crystal plane oriented to the (111) plane or (111) plane. The composition ratio x is, for example, greater than 0.3 and less than or equal to 1.

The polycrystalline $Si_{1-y}Ge_y$ layer (hereinafter referred to as a polycrystalline SiGe layer) 5 is formed by, for example, CVD process. The CVD process is performed at, for example, 450° C. or less. The polycrystalline SiGe layer 5 may contain impurities which lower its resistance. The CVD process is, for example, a plasma enhanced chemical vapor deposition (PECVD) process or a low-pressure chemical vapor deposition (LPCVD) process. By performing the CVD process to formation of the polycrystalline SiGe layer 5, lowering of the throughput is restricted even if the polycrystalline SiGe layer 5 is thick (for example, 10 µm or more).

Since the difference between the lattice constant of the alloy layer 4a and that of the polycrystalline SiGe layer 5 is smaller than the difference between the lattice constant of the amorphous metal layer 2 and that of the polycrystalline SiGe layer 5, a polycrystalline SiGe layer 5 with reduced stress is formed on the amorphous layer 1. Furthermore, the annealing for forming the precursor layer 4 can be performed at 450° C. or less. Also, the CVD process for forming the polycrystalline SiGe layer 5 can also be performed at a low temperature of 450° C. or less. Thus, the above annealing and the CVD process are prevented from influencing another layer which is located under the amorphous layer 1, such as a CMOS circuit.

Thereafter, in some kinds of devices (for example, an acceleration sensor to be described later), the amorphous layer 1 is removed. Also, in other kinds of devices, in addition to the amorphous layer 1, the amorphous metal layer 2 is further removed, or both the amorphous metal layer 2 and the orientation layer 3 are further removed, or the amorphous metal layer 2, the orientation layer 3 and the alloy layer 4a are further removed.

The following explanation is given with respect to the case where the method for forming the SiGe layer according to the first embodiment is applied to an acceleration sensor including a MEMS device.

Figure 6:
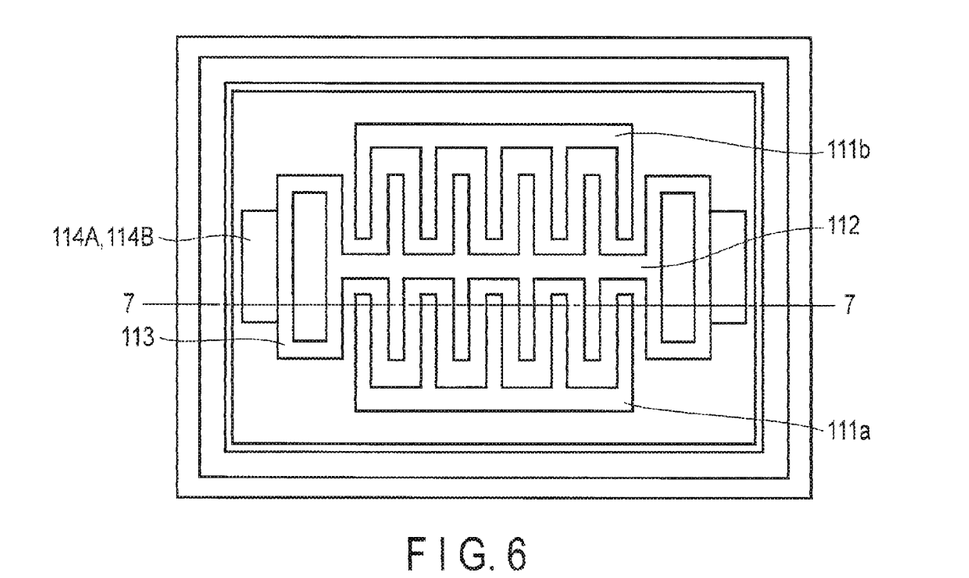
FIG. 6 is a plan view schematically showing an acceleration sensor including a MEMS device according to the first embodiment.
Figure 7:
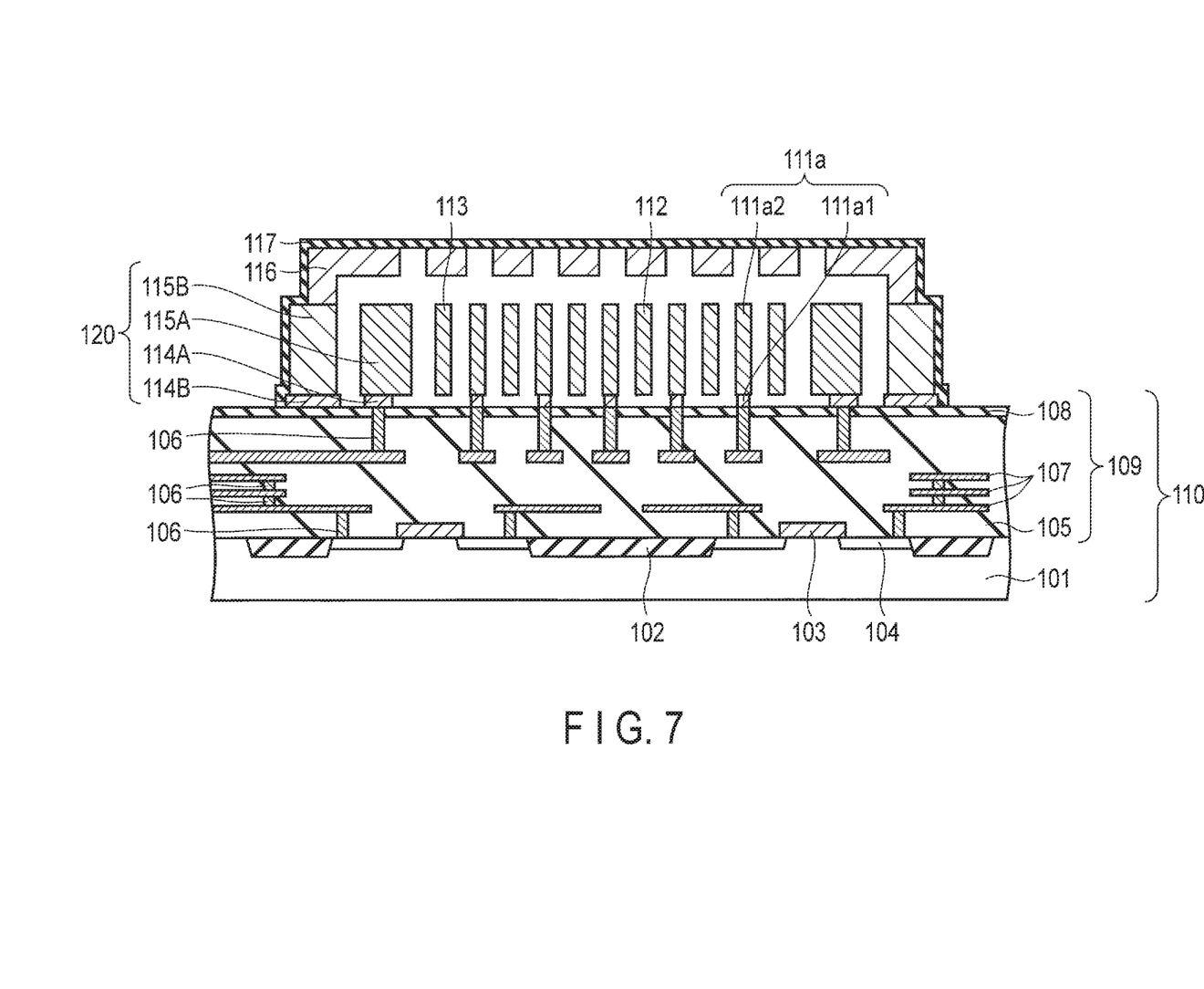
FIG. 7 is a cross-sectional view taken along line 7-7 in FIG. 6.

FIG. 6 is a plan view schematically showing an acceleration sensor including the MEMS device according to the first embodiment. FIG. 7 is a cross-sectional view taken along line 7-7 in FIG. 6.

It should be noted that in order to simplify FIG. 6, it shows an MEMS device which detects an acceleration in one of a horizontal direction (x-direction) and a vertical direction (y-direction) in a plane as shown in the figure. Also, the method for forming the SiGe layer according to the first embodiment can also be applied to a MEMS device which detects an acceleration in a height direction (z-direction) as shown in FIG. 7.

The acceleration sensor according to the first embodiment comprises the substrate 110 and the MEMS device 120 provided on the substrate 110. The substrate 110 comprises the silicon substrate 101 and a CMOS integrated circuit 109 provided on the silicon substrate 101.

The MEMS device 120 comprises comb-shaped first and second fixed electrodes 111a and 111b which are fixed on the substrate 110, and comb-shaped movable electrodes 112 which are to be displaced rightwards or leftwards in accordance with the variation of the acceleration.

The first fixed electrode 111a and the movable electrode 112 are arranged such that a comb-shaped portion of the first fixed electrode 111a and a comb-shaped portion of the movable electrode 112 are engaged with each other by a gap. Similarly, the second fixed electrode 111b and the movable electrode 112 are arranged such that a comb-shaped portion of the second fixed electrodes 111b and a comb-shaped portion of the movable electrode 112 are engaged with each other by a gap.

The first fixed electrodes 111a and the movable electrode 112 form first capacitors. The second fixed electrodes 111b and the movable electrode 112 form second capacitors. The difference between the capacitances of the first and second capacitors varies in accordance with the variation of the acceleration. The CMOS integrated circuit 109 includes a circuit (not shown) for performing differential detection with respect to the variation of the difference between the capacitances of the first and second capacitors.

The movable electrode 112 is connected to anchor portions 114A and 115A which are provided on the substrate 110, with a spring portion 113 interposed between the anchor portions 114A and 115A and the substrate 110. Furthermore, an anchor portion 114B is provided on part of the substrate 10 which is located outward of the anchor portion 114A. On the anchor portion 114B, an anchor portion 115B is provided.

A ceiling portion 116 including a plurality of through holes is provided above the fixed electrodes 111a and 111b, the movable electrode 112 and the spring portion 113. The ceiling portion 116 is supported by the anchor portion 115B. Also, the cap film 117 is provided above the anchor portions 114B and 115B and the ceiling portion 116. The cap film 117 may be formed of either a multi-layer insulating film or a single-layer insulating film. The cap film 117 faces the through holes of the ceiling portion 116. The cap film 117 may close the through holes of the ceiling portion 116. The substrate 110, the anchor portions 114B and 115B, the ceiling portion 116 and the cap film 117 define a cavity for accommodating the fixed electrodes 111a and 111b and the movable electrode 112.

FIGS. 8-16 are cross-sectional views for explaining the manufacturing method of the acceleration sensor including the MEMS device according to the first embodiment. FIGS. 8-16 correspond to cross-sectional views taken along line 7-7 in the plan view of FIG. 6.

Figure 8:
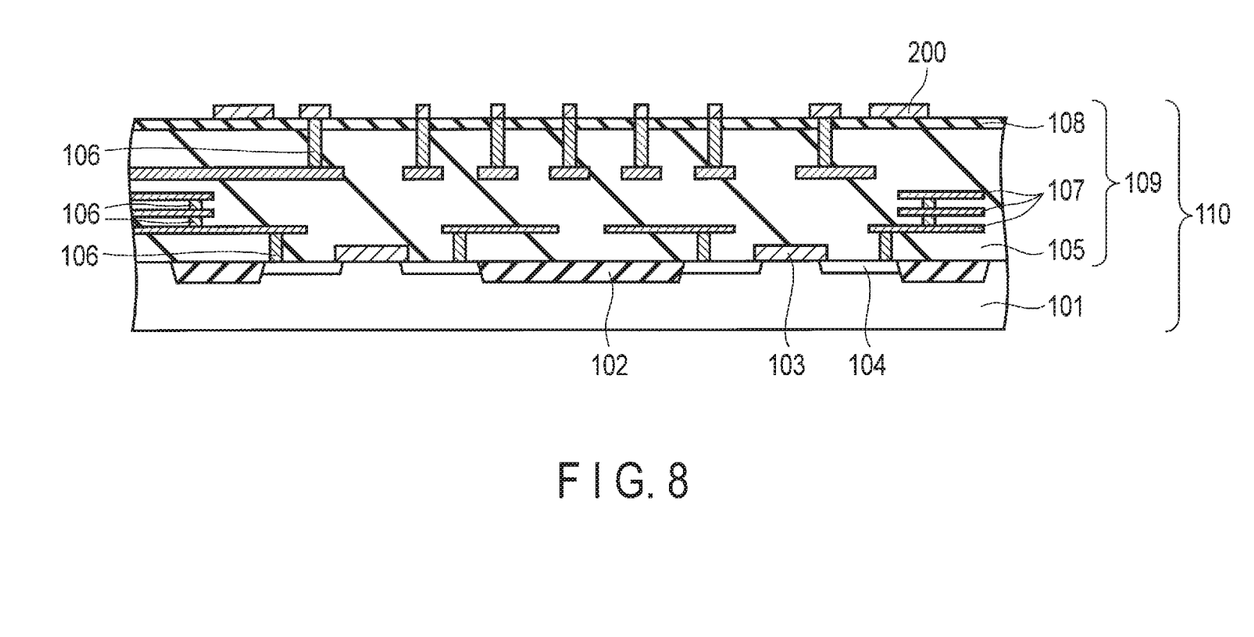
FIG. 8 is a cross-sectional view for explaining a process in a method for manufacturing the acceleration sensor including the MEMS device according to the first embodiment.

[FIG. 8]

A CMOS integrated circuit 109 is formed on the silicon substrate 101 by a well-known method. In FIG. 8, an element isolation region 102, a gate (gate electrode, gate insulating film) 103, a source/drain region 104, an insulating film 105, a contact plug 106, an interconnect 107 and an insulating film 108 are illustrated. The insulating film 105 and the insulating film 108 are, for example, a silicon oxide film and a silicon nitride film, respectively.

A SiGe layer 200 is formed on the substrate 110, and is then patterned to have a predetermined form by photolithography process and etching process. The SiGe layer 200 includes amorphous SiGe and crystalline SiGe in the early stage of forming the SiGe layer 200. The patterned SiGe layer 200 includes patterns corresponding to the fixed electrodes 111a1 and the anchor portions 114A and 114B as shown in FIG. 7. The SiGe layer 200 may contain impurities which lower the resistance of the SiGe layer 200.

Figure 9:
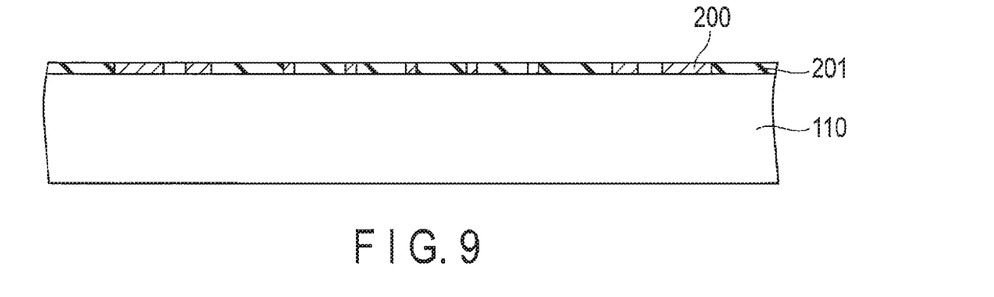
FIG. 9 is a cross-sectional view for explaining a process following the process of FIG. 8 in the method for manufacturing the acceleration sensor according to the first embodiment.

[FIG. 9]

FIGS. 9-16 show the silicon substrate 101 and the CMOS integrated circuit 109 as a single body, i.e., as the substrate 110, in order to simplify them.

A sacrificial layer 201 is formed on the substrate 110 and the SiGe layer 200; and then by CMP process, the sacrificial layer 20 is polished until the SiGe layer 200 is exposed, and surfaces of the sacrificial layer 201 and the SiGe layer 200 are planarized. The sacrificial layer 201 is formed of, for example, a silicon oxide.

Figure 10:
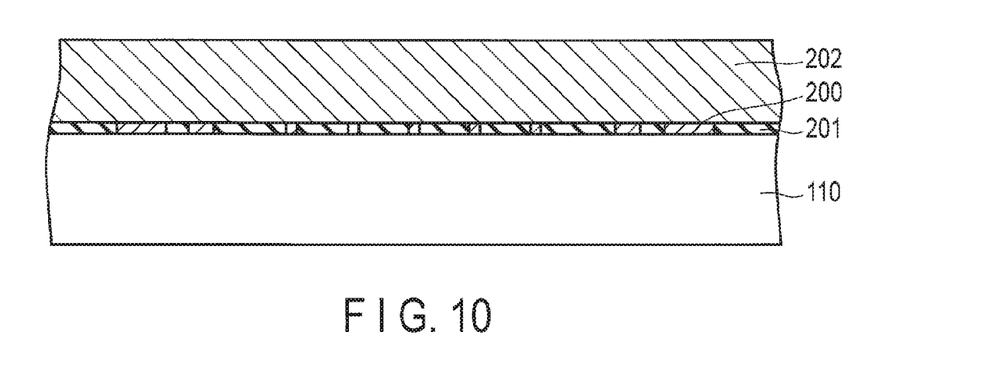
FIG. 10 is a cross-sectional view for explaining a process following the process of FIG. 9 in the method for manufacturing the acceleration sensor according to the first embodiment.

[FIG. 10]

By the method for forming the polycrystalline SiGe layer according to the first embodiment, a layer 202 including a polycrystalline SiGe layer (hereinafter referred to as a SiGe layer 202) with small stress is formed on the SiGe layer 200 and the sacrificial layer 201 without causing a reduction in throughput. The polycrystalline SiGe layer has a thickness of, for example, 10 μm or more. Although the SiGe layer 202 actually includes the amorphous metal layer 2, the orientation layer 3, the precursor layer 4a and the polycrystalline SiGe layer 5 as shown in FIG. 5, the amorphous metal layer 2, the orientation layer 3 and the precursor layer 4a are omitted in FIGS. 10-16. Furthermore, the SiGe layer 200 and the sacrificial layer 201 correspond to the amorphous layer 1 as shown in FIG. 5.

Figure 11:
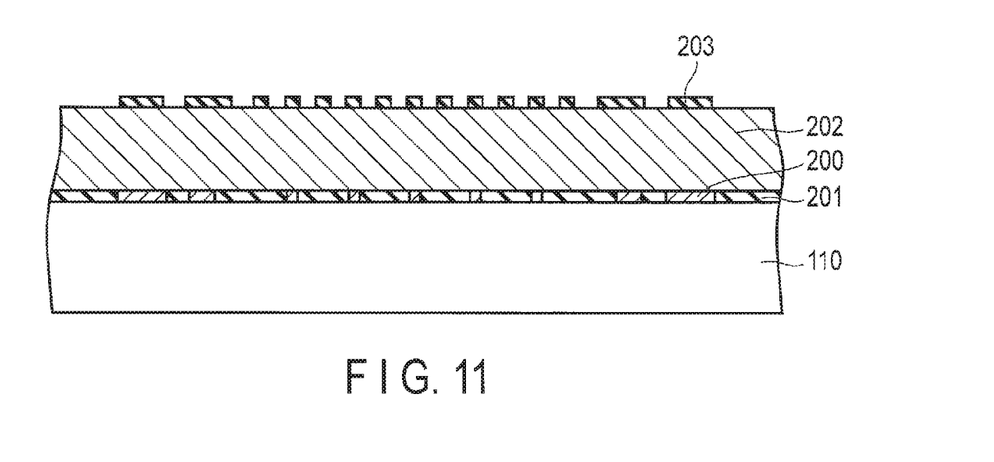
FIG. 11 is a cross-sectional view for explaining a process following the process of FIG. 10 in the method for manufacturing the acceleration sensor according to the first embodiment.

[FIG. 11]

A sacrificial layer 203 is formed on the SiGe layer 202. The sacrificial layer 203 includes patterns corresponding to the fixed electrodes 111a2, the movable electrode 112, the spring portion 113 and the anchor portions 115A and 115B.

Figure 12:
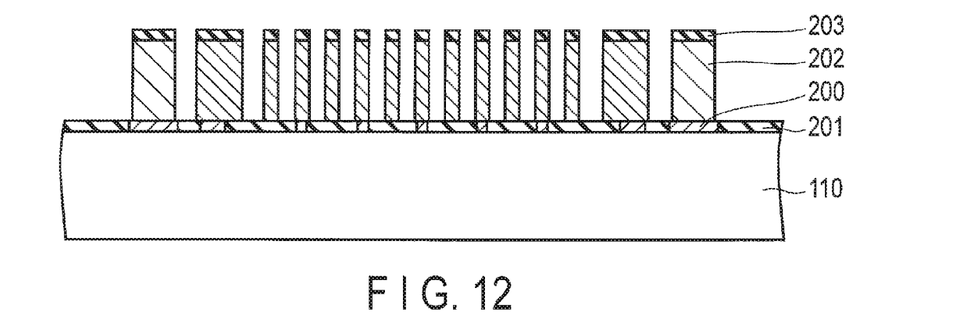
FIG. 12 is a cross-sectional view for explaining a process following the process of FIG. 11 in the method for manufacturing the acceleration sensor according to the first embodiment.

[FIG. 12]

The SiGe layer 202 is patterned to have a predetermined form by etching using the sacrificial layer 203 as a mask. The patterned SiGe layer 202 includes patterns corresponding to the fixed electrodes 111a2, the movable electrode 112, the spring portion 113 and the anchor portions 115A and 115B as shown in FIG. 7. Since the SiGe layer 202 has small stress, the comb-shaped portions of the first fixed electrode 111a and the movable electrode 112 are suppressed from deforming. As a result, the performance of the acceleration sensor is suppressed from degrading.

Figure 13:
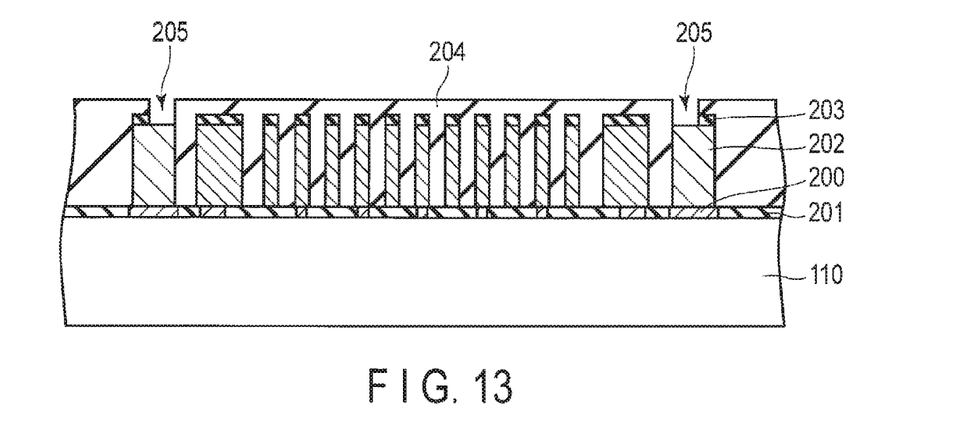
FIG. 13 is a cross-sectional view for explaining a process following the process of FIG. 12 in the method for manufacturing the acceleration sensor according to the first embodiment.

[FIG. 13]

A sacrificial layer 204 is formed on the sacrificial layer 201 and the SiGe layer 202, and then an opening portion 205 is formed in the sacrificial layer 204 to expose part of the SiGe layer 202. The opening portion 205 is formed in a position corresponding to a part of the upper surface of the anchor portion 115B as shown in FIG. 7. The forming of the opening portion 205 is performed by patterning the sacrificial layers 203 and 204 using for example a photolithography process and an etching process.

Figure 14:
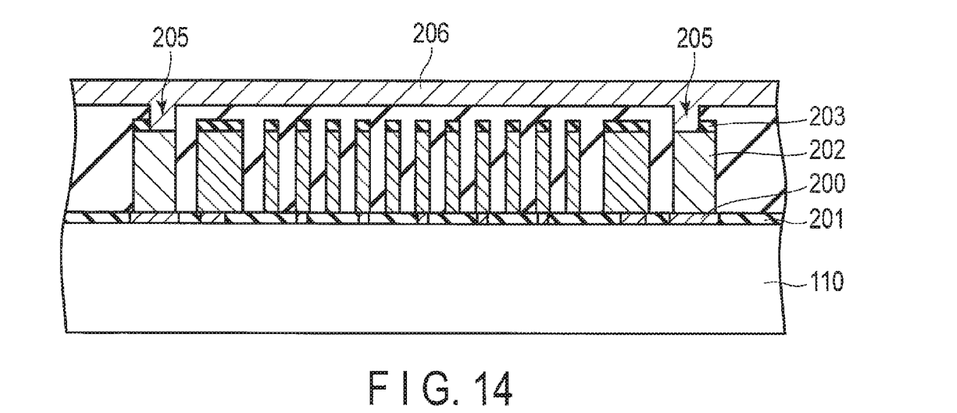
FIG. 14 is a cross-sectional view for explaining a process following the process of FIG. 13 in the method for manufacturing the acceleration sensor according to the first embodiment.

[FIG. 14]

A SiGe layer 206 is formed on the sacrificial layer 204 to fill in the opening portion 205. If a well-known low-temperature CVD process is performed, the SiGe layer 206 is made amorphous. Also, the SiGe layer 206 may be formed by applying the method for forming the polycrystalline SiGe layer according to the first embodiment.

Figure 15:
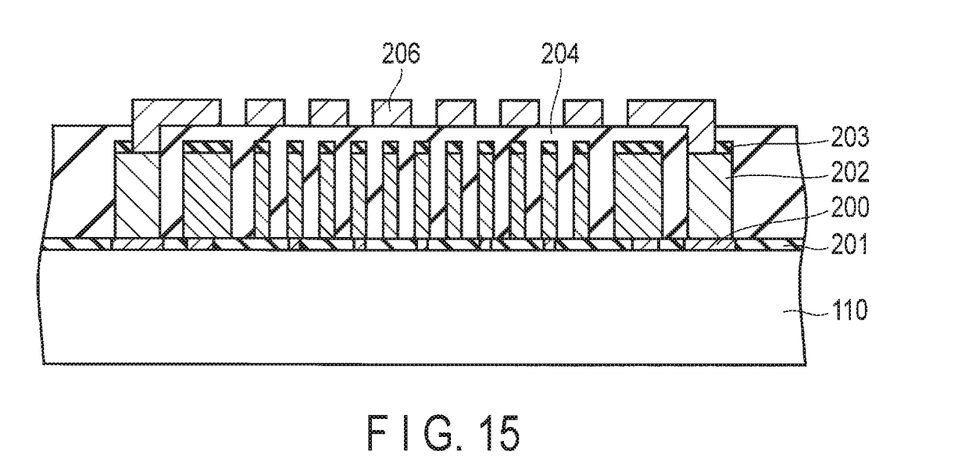
FIG. 15 is a cross-sectional view for explaining a process following the process of FIG. 14 in the method for manufacturing the acceleration sensor according to the first embodiment.

[FIG. 15]

The SiGe layer 206 is patterned to have a predetermined form by photography process and etching process. The patterned SiGe layer 206 includes a pattern which corresponds to the ceiling portion 116 including through holes as shown in FIG. 7.

Figure 16:
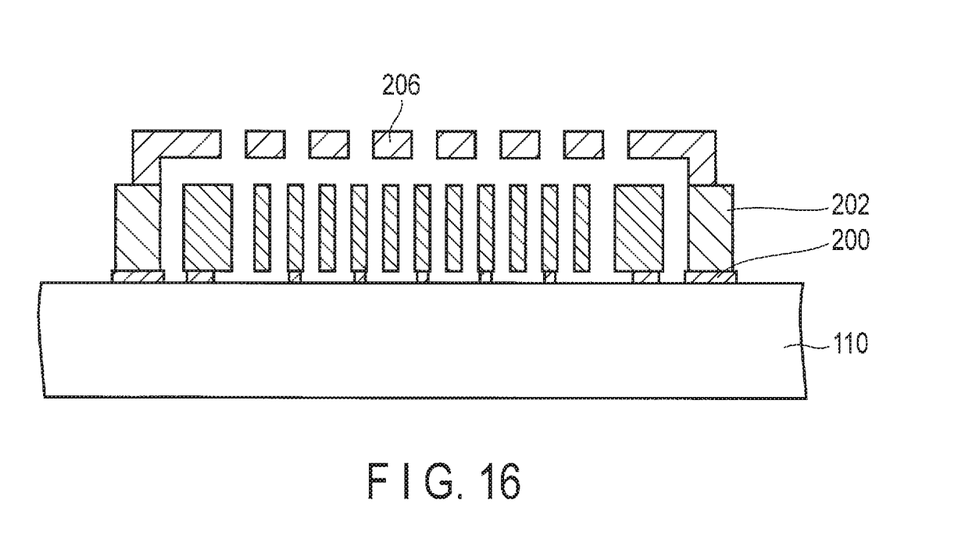
FIG. 16 is a cross-sectional view for explaining a process following the process of FIG. 15 in the method for manufacturing the acceleration sensor according to the first embodiment.

[FIG. 16]

By a dry process, the sacrificial layers 201, 203 and 204 are removed. If the sacrificial layers 201, 203 and 204 are formed of a silicon oxide, they are removed by a dry process using, for example, hydrogen fluoride gas (HF gas).

As described above, although the SiGe layer 202 actually includes the amorphous metal layer 2, the orientation layer 3, the precursor layer 4a, and the polycrystalline SiGe layer 5 as shown in FIG. 5, the amorphous metal layer 2, the orientation layer 3 and the precursor layer 4a are omitted in the FIG. 16. After removing the sacrificial layer 201, there is a case where the layer 2, or the layers 2 and 3, or the layers 2, 3 and 4a are removed.

Then, upon formation of a cap film, an acceleration sensor including the MEMS device shown in FIG. 7 is obtained. According to the first embodiment, it is possible to obtain a MEMS device including a SiGe layer having a lower stress, and thus provide a MEMS device including a movable portion having a high Q value.

Figure 17:
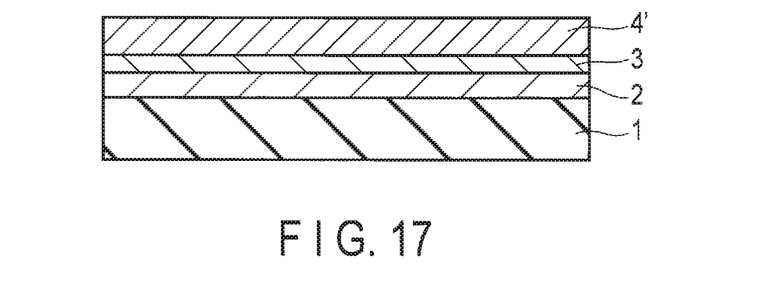
FIG. 17 is a cross-sectional view for explaining a process in a method for forming a silicon-germanium layer according to a second embodiment.
Figure 18:
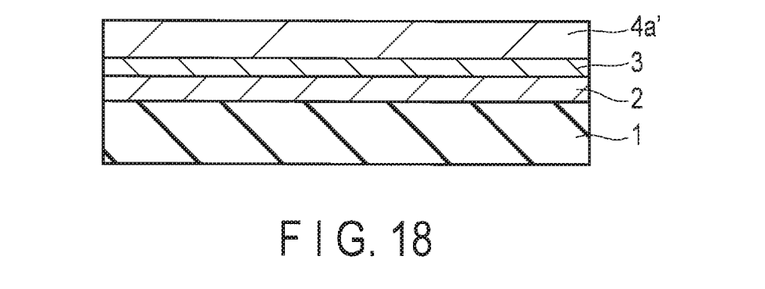
FIG. 18 is a cross-sectional view for explaining a process following the process of FIG. 17 in the method for forming the silicon-germanium layer according to the second embodiment.
Figure 19:
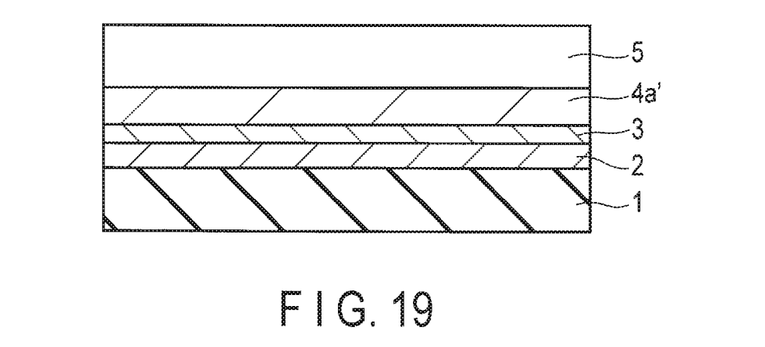
FIG. 19 is a cross-sectional view for explaining a process following the process of FIG. 18 in the method for forming the silicon-germanium layer according to the second embodiment.

It is also possible to apply the method for forming the SiGe layer according to the first embodiment to another kind of a sensor including an MEMS device, for example, a gyro sensor and a pressure sensor Second Embodiment FIGS. 17-19 are cross-sectional views for explaining a method for forming a SiGe layer according to the second embodiment. In the second embodiment, a precursor layer 4' containing an alloy of Si and metal (metal silicide) is formed on an orientation layer 3, whereas in the first embodiment, in the process as shown in FIG. 3, the precursor layer 4 containing an alloy of SiGe and metal is formed. That is, in the present embodiment, the composition $Si_{1-x}Ge_x$ of SiGe in the Ni $(SiGe)_2$ layer or the Co $(SiGe)_2$ layer, the composition ratio x is 0.

[FIG. 17]

The processes of FIGS. 1 and 2 according to the first embodiment are carried out, and then a precursor layer (first layer) 4' containing an alloy of Si and metal is formed on an orientation layer 3.

The precursor layer 4' comprises, for example, a layer (single layer) in which Si and metal are mixed together, or a laminate of a layer containing Si and a layer containing metal. The precursor layer 4' is formed by, for example, sputtering process as well as the precursor layer 4.

The amounts of Si and metal in the precursor layer 4 are set such that when the precursor layer 4' is heated, a layer of an alloy of Si and metal (for example, $NiSi_2$ or $CoSi_2$) is formed. The orientation plane, of each of $NiSi_2$ and $CoSi_2$ is a (111) plane or (110) plane. The lattice constant of each of $NiSi_2$ and $CoSi_2$ is close to that of SiGe.

[FIG. 18]

When the precursor layer 4' is heated (annealed) in an inactive gas atmosphere, the precursor layer 4' is changed to an alloy layer 4a' of Si and metal. The inactive gas atmosphere is an atmosphere containing, for example, nitrogen or argon. The above annealing is performed at, for example, 450° C. or less.

By the above annealing, it is possible to obtain an alloy layer 4a' ($NiSi_2$ layer or $CoSi_2$ layer) which has the same orientation plane as SiGe and a lattice constant close to that of SiGe.

[FIG. 19]

A polycrystalline SiGe layer 5 is formed on the alloy layer 4a'. The polycrystalline SiGe layer 5 is formed by, for example, CVD process. The CVD process is performed at, for example, 450° C. or less.

In the method for forming the SiGe layer according to the second embodiment, the same advantage can be obtained as in the first embodiment. Furthermore, the method for forming the SiGe layer according to the second embodiment can be applied to the method for manufacturing the sensor including the MEMS device, as well as that according to the first embodiment.

Third Embodiment

FIGS. 20-24 are cross-sectional views for explaining a method for forming a SiGe layer according to the third embodiment.

Figure 20:
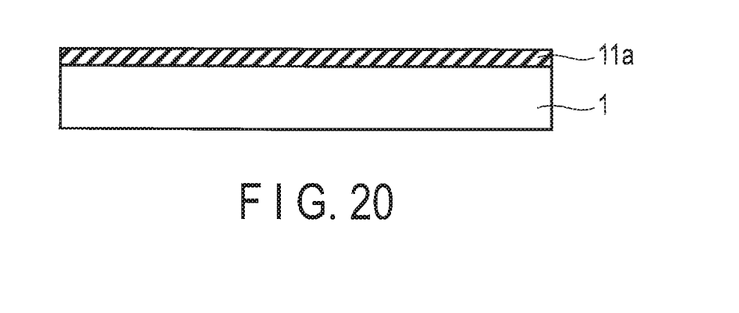
FIG. 20 is a cross-sectional view for explaining a process in a method for forming a silicon-germanium layer according to a third embodiment.

[FIG. 20]

A first germanium oxide layer 11a is formed on an amorphous layer 1.

Figure 21:
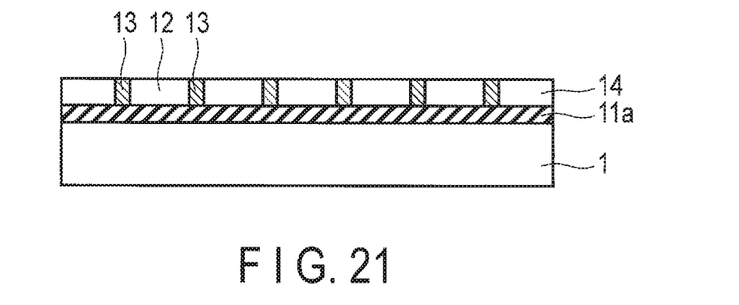
FIG. 21 is a cross-sectional view for explaining a process following the process of FIG. 20 in the method for forming the silicon-germanium layer according to the third embodiment.

[FIG. 21]

A layer (first layer) 14 including an amorphous SiGe layer 12 and a plurality of Ag columns (columnar members) 13 is formed on the first germanium oxide layer 11a. An amorphous Si layer may be formed instead of the amorphous SiGe layer 12.

Figure 25:
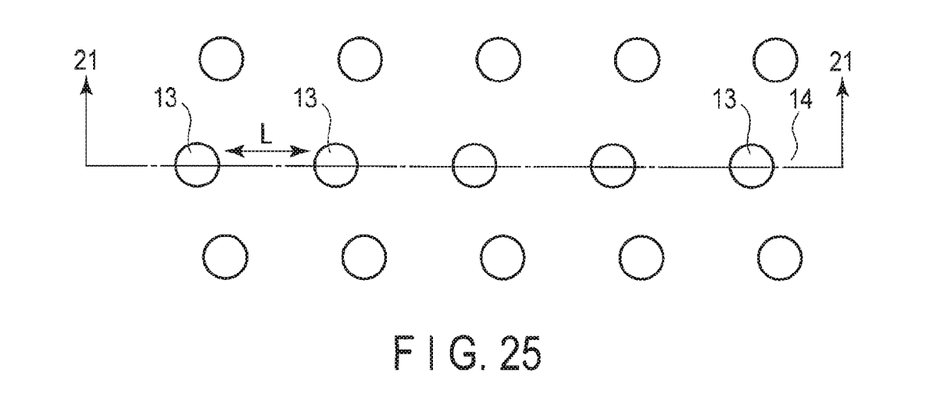
FIG. 25 is a plan view schematically showing an amorphous SiGe layer and Ag columns according to the third embodiment.

The thickness of the amorphous SiGe layer 12 is set to fall within the range of, for example, 2 to 20 nm. Furthermore, dimensions of the amorphous SiGe layer 12 in the lateral direction, etc. are limited to predetermined values or less by the Ag columns 13. FIG. 25 is a cross-sectional view of the first layer 14. The cross-sectional view of the amorphous SiGe layer 12 as shown in FIG. 21 corresponds to a cross-sectional view taken along line 21-21 in FIG. 25. The distance L between adjacent two of the Ag columns 13 in the lateral direction is a fixed value (for example, several tens of nanometers) or less. Because of such a structure, SiGe atoms in the amorphous SiGe layer 12 do not easily move in the lateral direction. The first layer 14 can be formed by, for example, depositing SiGe and Ag on the germanium oxide layer 11a by sputtering process. The sputtering process uses a target in which for example, Ge, Ag and Si are mixed together. As the ratios between Ge, Ag and Si in the target, for example, Ge:Si=6:4, and Ge:Ag=6:4. Also, even if Al is used in place of Ag, it is possible to apply a target having a similar composition to that of the above target.

Figure 22:
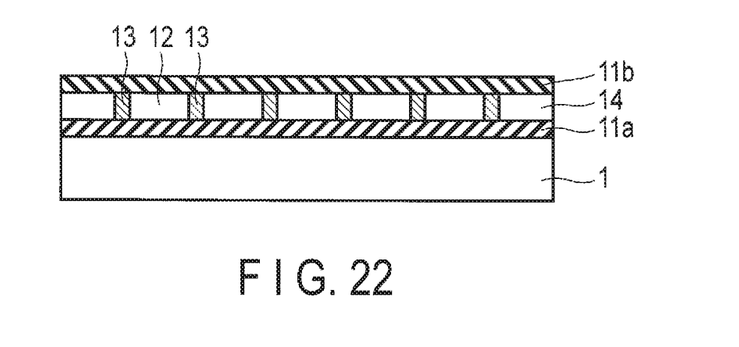
FIG. 22 is a cross-sectional view for explaining a process following the process of FIG. 21 in the method for forming the silicon-germanium layer according to the third embodiment.

[FIG. 22]

A second germanium oxide layer 11b is formed on the first layer 14. An upper surface of the amorphous SiGe layer 12 is caped with the second germanium oxide layer 11b.

Figure 23:
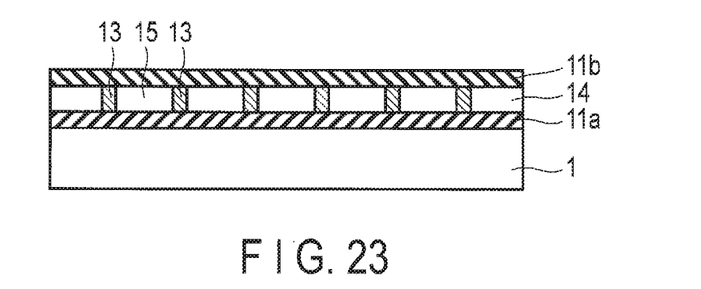
FIG. 23 is a cross-sectional view for explaining a process following the process of FIG. 22 in the method for forming the silicon-germanium layer according to the third embodiment.

[FIG. 23]

Using a metal induced lateral crystallization (MILC) process, the amorphous SiGe layer 12 is changed to a polycrystalline SiGe layer 15. When the amorphous Si layer is formed instead of the amorphous SiGe layer 12, the amorphous Si layer is changed to the polycrystalline SiGe layer 15. The thickness of the polycrystalline SiGe layer 15 is, for example, 10 to 20 nm or less. The MILC process is carried out at, for example, 450° C. or less.

The polycrystalline SiGe layer 15 is examined by an X-ray diffraction (XRD) method. As a result, it is confirmed that the crystal plane of the polycrystalline SiGe layer 15 is oriented to a (111) plane.

Figure 24:
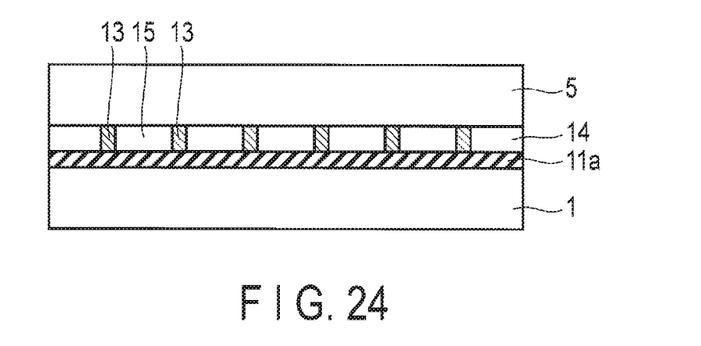
FIG. 24 is a cross-sectional view for explaining a process following the process of FIG. 23 in the method for forming the silicon-germanium layer according to the third embodiment.

[FIG. 24]

The second germanium oxide layer 11b is removed; and then with the polycrystalline SiGe layer 15 used as an underlying layer, a polycrystalline SiGe layer 5 having a crystal plane oriented to a (111) plane and also having a reduced stress is formed on the first layer 14.

It should be noted that columnar members containing metal (for example, aluminum) other than Ag may be used. Furthermore, columnar members containing insulators such as silicon oxide may be used.

The following is another embodiment of a device.

The device comprises an amorphous metal layer containing at least one of tantalum, tantalum nitride, and nickel tantalum. The device further comprises a first orientation layer provided on the amorphous metal layer, the first orientation layer having a crystal plane oriented to a (111) plane or a (110) plane, and containing Ni or Co. The device further comprises a second orientation layer provided on the first orientation layer, the second orientation layer having a crystal plane oriented to a (111) plane or a (110) plane, and containing a $Ni(Si_{1-x}Ge_x)_2$ layer or a $Co(Si_{1-x}Ge_x)_2$ layer, where 0≤x≤1. The device further comprises a layer containing silicon-germanium (hereafter referred to as "SiGe layer") and having a crystal plane oriented to a (111) plane or a (110) plane.

The device may further comprise a substrate, and a sensor provide on the substrate. The sensor may comprise the SiGe layer.

The sensor may further comprise a member, and the member and the substrate constituting a cavity in which the sensor is housed.

The member may comprise a film.

The sensor may comprise a fixed portion and a movable portion.

The movable portion may comprise the SiGe layer.

The sensor may comprise a comb-shaped fixed portion fixed on the substrate, and a movable portion arranged to be engaged with the comb-shaped fixed portion by a gap.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A method of manufacturing a device, comprising:
    forming an amorphous metal layer;
    forming a metal layer containing metal and having a crystal plane oriented to a predetermined plane, on the amorphous metal layer;
    forming a first layer containing semiconductor including silicon, and metal identical to the metal contained in the metal layer, on the metal layer;
    changing the first layer to a second layer containing a compound of the semiconductor and the metal, the compound having a crystal plane oriented to the predetermined plane; and
    forming a third layer containing polycrystalline silicon-germanium and having a crystal plane oriented to the predetermined plane, on the second layer.

2. The method according to claim 1, wherein a difference between lattice constants of the second layer and the third layer is smaller than a difference between lattice constants of the first layer and the third layer.

3. The method according to claim 1, wherein the amorphous metal layer has a thickness falling within a range of 2 to 50 nm.

4. The method according to claim 1, wherein a total thickness of the amorphous metal layer and the metal layer is less than or equal to 50 nm.

5. The method according to claim 1, wherein the amorphous metal layer contains tantalum or tantalum nitride.

6. The method according to claim 1, wherein the amorphous metal layer is formed on an amorphous layer.

7. The method according to claim 6, wherein the amorphous layer contains insulator.

8. The method according to claim 1, wherein the forming the metal layer comprises depositing the metal on the amorphous metal layer by sputtering process.

9. The method according to claim 1, wherein the metal layer contains nickel or cobalt.

10. The method according to claim 1, wherein the forming the first layer comprises forming a single layer containing the semiconductor and the metal.

11. The method according to claim 1, wherein the forming the first layer comprises forming a laminate of a layer containing the semiconductor and a layer containing the metal.

12. The method according to claim 1, wherein the semiconductor further includes germanium.

13. The method according to claim 1, wherein the forming the second layer comprises annealing the first layer.

14. The method according to claim 1, wherein the second layer is a $Ni(Si_{1-x}Ge_x)_2$ layer or a $Co(Si_{1-x}Ge_x)_2$ layer, where $0 \leq x \leq 1$.

15. The method according to claim 14, wherein x is 0.3 or more.

16. The method according to claim 14, wherein the $Ni(Si_{1-x}Ge_x)_2$ layer or the $Co(Si_{1-x}Ge_x)_2$ layer has a thickness which falls within a range of 2 nm to 50 nm.

17. The method according to claim 1, wherein the annealing is performed at 450° C. or less.

18. The method according to claim 1, wherein the forming the third layer comprises performing a CVD process at 450° C. or less.

19. The method according to claim 1, wherein the predetermined plane is a (111) plane or a (110) plane.

* * * * *